(12) United States Patent
Lung et al.

(10) Patent No.: US 7,514,367 B2
(45) Date of Patent: Apr. 7, 2009

(54) METHOD FOR MANUFACTURING A NARROW STRUCTURE ON AN INTEGRATED CIRCUIT

(75) Inventors: Hsiang Lan Lung, Elmsford, NY (US); Chiahua Ho, Kaoshing (TW); Shih Hung Chen, Elmsford, NY (US); Chieh Fang Chen, Panchiao (TW)

(73) Assignee: Macronix International Co., Ltd., Hsinchu (TW)

( * ) Notice: Subject to any disclaimer, the term of this patent is extended or adjusted under 35 U.S.C. 154(b) by 224 days.

(21) Appl. No.: 11/382,739

(22) Filed: May 11, 2006

(65) Prior Publication Data

US 2006/0286743 A1    Dec. 21, 2006

Related U.S. Application Data

(63) Continuation-in-part of application No. 11/155,067, filed on Jun. 17, 2005, now Pat. No. 7,321,130.

(51) Int. Cl.
*H01L 21/302* (2006.01)
(52) U.S. Cl. .............. 438/734; 438/3; 438/84; 438/95; 438/584; 438/595; 438/947
(58) Field of Classification Search ............. 438/3, 438/84, 95, 584, 595, 734, 947
See application file for complete search history.

(56) References Cited

U.S. PATENT DOCUMENTS

| 3,271,591 | A |   | 9/1966  | Ovshinsky |
| 3,530,441 | A |   | 9/1970  | Ovshinsky |
| 4,599,705 | A |   | 7/1986  | Holmberg et al. |
| 4,719,594 | A |   | 1/1988  | Young et al. |
| 4,769,339 | A | * | 9/1988  | Ishii ........................ 438/179 |
| 4,876,220 | A |   | 10/1989 | Mohsen et al. |
| 5,166,096 | A |   | 11/1992 | Cote et al. |
| 5,166,758 | A |   | 11/1992 | Ovshinsky et al. |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Zandra Smith
*Assistant Examiner*—Bac H Au
(74) *Attorney, Agent, or Firm*—Haynes Beffel & Wolfeld LLP (57) ABSTRACT

A method of manufacturing for providing a narrow line, such as a phase change bridge, on a substrate having a top surface, includes first forming a layer of first material on the substrate. Then, a layer of a pattern material is applied on the layer of first material, and a pattern is defined. The pattern includes a ledge having a sidewall extending substantially to the layer of first material. A sidewall etch mask is formed on the ledge, and used to define a line of the first material on the substrate having a width substantially determined by the width of the sidewall etch mask.

13 Claims, 7 Drawing Sheets

U.S. PATENT DOCUMENTS

| | | | |
|---|---|---|---|
| 5,177,567 | A | 1/1993 | Klersy et al. |
| 5,534,712 | A | 7/1996 | Ovshinsky et al. |
| 5,687,112 | A | 11/1997 | Ovshinsky |
| 5,688,713 | A | 11/1997 | Linliu et al. |
| 5,716,883 | A | 2/1998 | Tseng et al. |
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,291,137 | B1 | 9/2001 | Lyons et al. |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,596,589 | B2 | 7/2003 | Tseng et al. |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,859,389 | B2 * | 2/2005 | Idehara ..................... 365/163 |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 2004/0248339 | A1 | 12/2004 | Lung |
| 2005/0215009 | A1 | 9/2005 | Cho |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "a Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Call Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

METHOD FOR MANUFACTURING A NARROW STRUCTURE ON AN INTEGRATED CIRCUIT

RELATED APPLICATION DATA

The present application is a continuation-in-part of U.S. patent application Ser. No. 11/155,067; filed 17 Jun. 2005, which is incorporated by reference as if fully set forth herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to manufacturing methods for integrated circuits, including methods for making a narrow structure on a substrate, such as a narrow line of phase change material.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

It is desirable therefore to provide a memory cell structure having small dimensions and low reset currents, and a method for manufacturing such structure that meets tight process variation specifications needed for large-scale memory devices. It is further desirable to provide a manufacturing process and a structure which are compatible with manufacturing of peripheral circuits on the same integrated circuit. Also, manufacturing techniques for making nano-scale structures on integrated circuits and other substrates are needed.

SUMMARY OF THE INVENTION

Technology described herein includes a memory device comprising a first electrode having a top side, a second electrode having a top side and an insulating member between the first electrode and the second electrode. The insulating member has a thickness between the first and second electrodes near the top side of the first electrode and the top side of the second electrode. A thin film bridge crosses the insulating member, and defines an inter-electrode path between the first and second electrodes across the insulating member. The inter-electrode path across the insulating member has a path length defined by the width of the insulating member.

The volume of memory material subject of phase change can be very small, determined by the thickness of the insulating member (path length in the x-direction), the thickness of the thin film used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the lithographic processes used in manufacturing the memory cell. The width of the bridge is also smaller than a minimum feature size F that is specified for a lithographic process used in patterning the layer of material in embodiments of the present invention. Techniques for manufacturing the bridge, and defining the width of the bridge of memory material are described, which are based on forming and using a sidewall etch mask structure.

In an embodiment of the manufacturing method, the bridges of memory material are made by a process comprising a number of steps including the following:

providing a substrate having a top surface;

forming a layer of first material, such as the memory material, on the substrate;

forming a layer of a pattern material on the layer of first material;

defining a pattern in the layer of pattern material, the pattern including a ledge in the pattern material having a sidewall extending substantially to the layer of first material;

depositing a sidewall material over the ledge in the pattern material, and anisotropically etching the sidewall material to form a sidewall etch mask on the ledge, the sidewall etch mask having a first side away from the ledge and a second side proximate to the ledge, and covering the layer of first material in a line with a width between the first and second sides along the ledge, determined by the thickness of the deposited sidewall material on the ledge; and etching the layer of first material using the sidewall etch mask to define a line of the first material on the substrate having a width substantially determined by the width of the sidewall etch mask.

The sidewall etch mask can be used in a variety of processes to define the width of the line of material. One example process includes first etching the layer of first material using the first side of the sidewall etch mask and the pattern on the second side of the sidewall etch mask in the layer of pattern material as a combined etch mask; then removing the pattern material from the second side of the sidewall etch mask; and second etching remaining portions of the layer of first material using the second side of the sidewall etch mask to leave the line of the first material.

In another example process, the pattern material is removed from the second side of the sidewall etch mask, and then the layer of first material is etched using the first and second sides of the sidewall etch mask to leave the line of the first material.

In yet another alternative process, the layer of first material is first etched using the first side of the sidewall etch mask and the pattern on the second side of the sidewall etch mask in the layer of pattern material as a combined etch mask. Then a second sidewall material is deposited over the sidewall etch mask, and etched to form a covering sidewall over the sidewall etch mask. The pattern material is then removed from the second side of the sidewall etch mask, and remaining portions of the first material are etched using the second side of the sidewall etch mask to leave the line of the first material. The covering sidewall protects the side of the line of first material first etched using the first side of the sidewall etch mask from damage during the second etch.

The method described herein for formation of the bridge for use in a memory cell can be used to make a very small bridge for other uses. Nano-technology devices with very small bridge structures are provided using materials other than phase change to materials, like metals, dielectrics, organic materials, semiconductors, and so on.

Other aspects and advantages of the invention are shown in the following.

DETAILED DESCRIPTION

A detailed description of thin film fuse phase change memory cells and methods for manufacturing such memory cells and other narrow structures is provided with reference to FIGS. 1-14.

Figure 1:
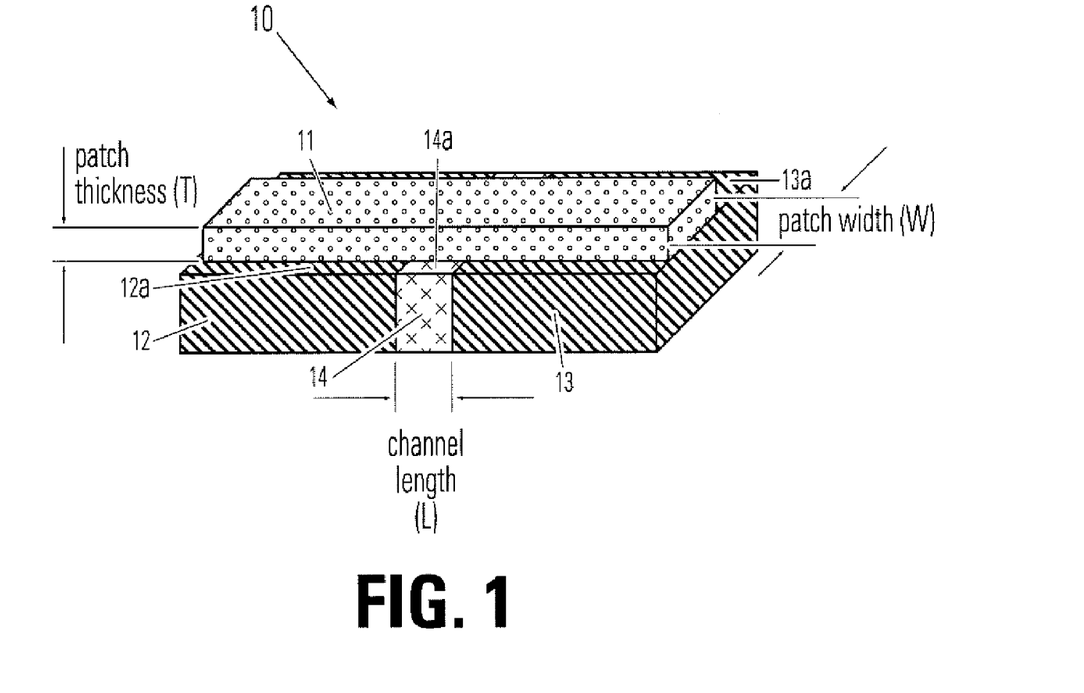
FIG. 1 illustrates an embodiment of a thin film bridge phase change memory element.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode and the bridge 11, and between the second electrode 13 and the bridge 11, are made on the bottom side of the bridge 11.

Access circuitry can be implemented to contact the first electrode 12 and the second electrode 13 in a variety of configurations for controlling the operation of the memory cell, so that it can be programmed to set the bridge 11 in one of the two solid phases that can be reversibly implemented using the memory material. For example, using a chalcogenide-based phase change memory material, the memory cell may be set to a relatively high resistivity state in which at least a portion of the bridge in the current path is in an amorphous state, and a relatively low resistivity state in which most of the bridge in the current path is in a crystalline state.

As can be appreciated, the active channel in the bridge of memory material can be made extremely small in the illustrated structure, reducing the magnitude of current needed to induce the phase changes.

FIG. 1 illustrates important dimensions of the memory cell 10. The length L (x-dimension) of the active channel is defined by the thickness of the insulating member 14 (called channel length in the figure), between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin-film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 30 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge to perform its purpose as memory element having at least two solid phases, reversible by a current or by a voltage applied across the first and second electrodes.

As illustrated in FIG. 1, the bridge width W (z-dimension) is likewise very small. This bridge width W is implemented in preferred embodiments so that it has a width less than 100 nm. In some embodiments, the bridge width W is about 30 nm or less. Bridge widths in the range of 5 to 30 nanometers are readily achieved using techniques described herein.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a memory cell as described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr ~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x:0~1; y:0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x:0~1; y:0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_x, O_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

Figure 2:
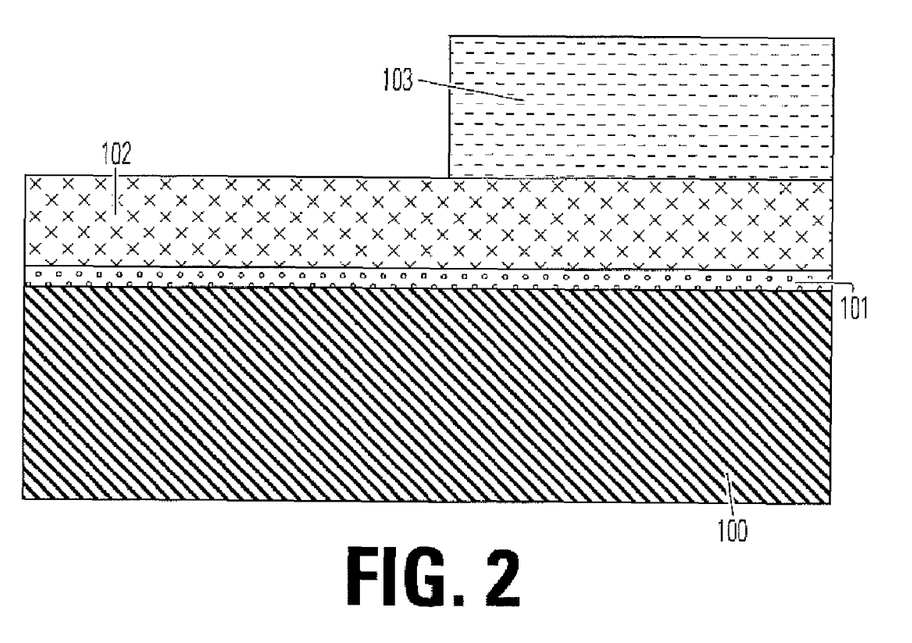
FIG. 2 illustrates a first stage in a procedure for forming a narrow bridge of material, based on a two-sided, side wall mask procedure.
Figure 3:
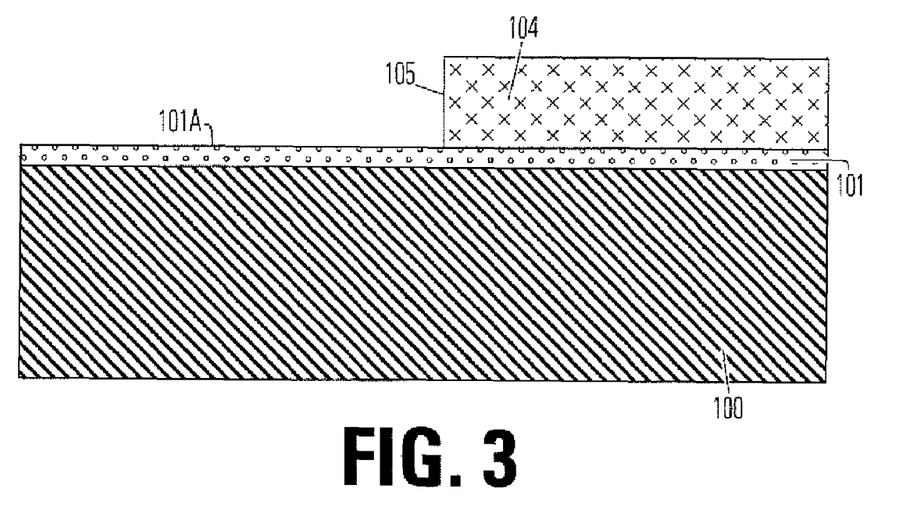
FIG. 3 illustrates a second stage in a procedure for forming a narrow bridge of material, based on a two-sided, side wall mask procedure.

FIGS. 2 through 10A-10B illustrate a technique for making narrow lines of material on a substrate, which can be applied to manufacturing the bridges of memory material over an electrode layer as described herein. As shown in FIG. 2, the process begins with providing a substrate 100 (such as an electrode layer) with a layer of material 101, such as the memory material described above. A protective cap layer may be included with the layer 101. A sacrificial layer 102 of pattern material, such as silicon dioxide, silicon nitride, polysilicon or the like is formed over the layer 101. A layer of photoresist is applied and patterned to provide an etch mask 103 over the sacrificial layer 102. In an embodiment making bridges of memory material as described above, the etch mask 103 can be defined with a width that is perpendicular to the page which is about equal to the length of the bridge material over the electrodes. The etch mask 103 is used during etching of the sacrificial layer 102, and then stripped, to form the structure shown in FIG. 3, in which the layer 101 has a sacrificial layer 104 with a pattern defined by the etch mask 103, including a ledge 105 extending substantially to the surface 101A of the layer 101. In embodiments of the process, the substrate 100 comprises an electrode layer as shown in FIG. 1, including electrodes comprising TiN or other suitable contact material for the material in layer 101. The material in layer 101 comprises GST in an embodiment of the process, for which TiN is a suitable electrode material. Layer 104 may comprise a plasma enhanced chemical vapor deposition silicon oxide layer thickness on the order of 120 to 200 nm, which has an etch chemistry significantly different than that of GST. The layer 104 may include an anti-reflective coating on the silicon oxide, as known in the art. Any anti-reflective layer is etched using the etch mask 103 before or at the same time as layer 104 is etched. The plasma enhanced thermal silicon oxide can be etched using a $C_4F_8/CO/Ar/O_2$ reactive ion etch recipe, which is selective of silicon oxide in layer 104 over the GST in layer 101 and stops on layer 101. The ledge resulting from the etch should be as vertical as possible in preferred embodiments.

Figure 4:
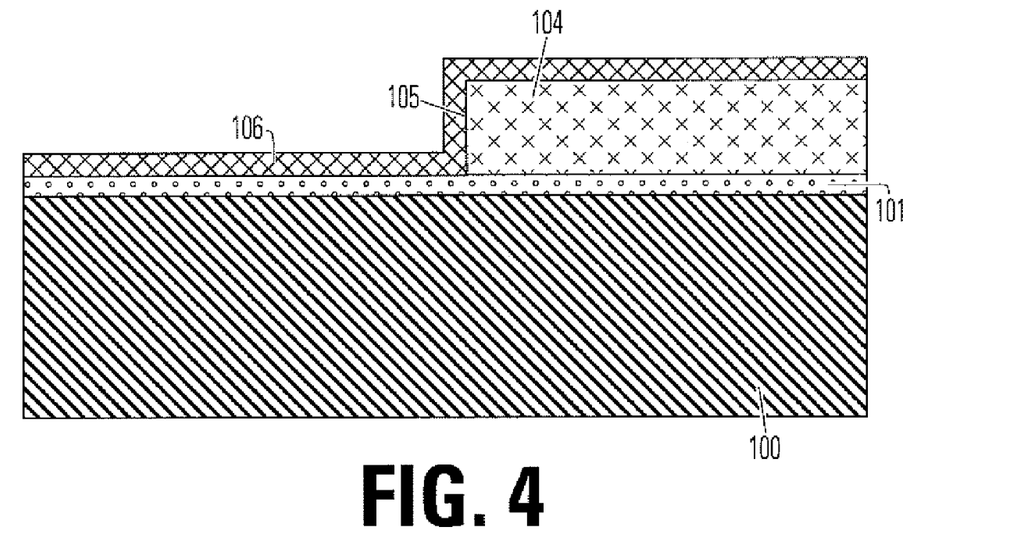
FIG. 4 illustrates a third stage in a procedure for forming a narrow bridge of material, based on a two-sided, side wall mask procedure.

FIG. 4 shows a next stage in which a layer 106 of sidewall material, such as a silicon nitride, silicon dioxide or polysilicon, is formed over the patterned sacrificial layer 104, including the ledge 105, and over exposed portions of the layer 101. The layer 106 comprises silicon nitride in the embodiment described above, in which the layer 104 comprises silicon oxide and the layer 101 comprises memory material such as GST. The silicon nitride layer is deposited using a conformal process to form a layer on the ledge having a thickness on the order of 20 nm, and preferrably in a range of about 10 to about 40 nm. If less conformal layers are formed, then the layer 106 should be deposited in a thicker layer, and over-etched to define the sidewall etch mask 107 described below.

Figure 5:
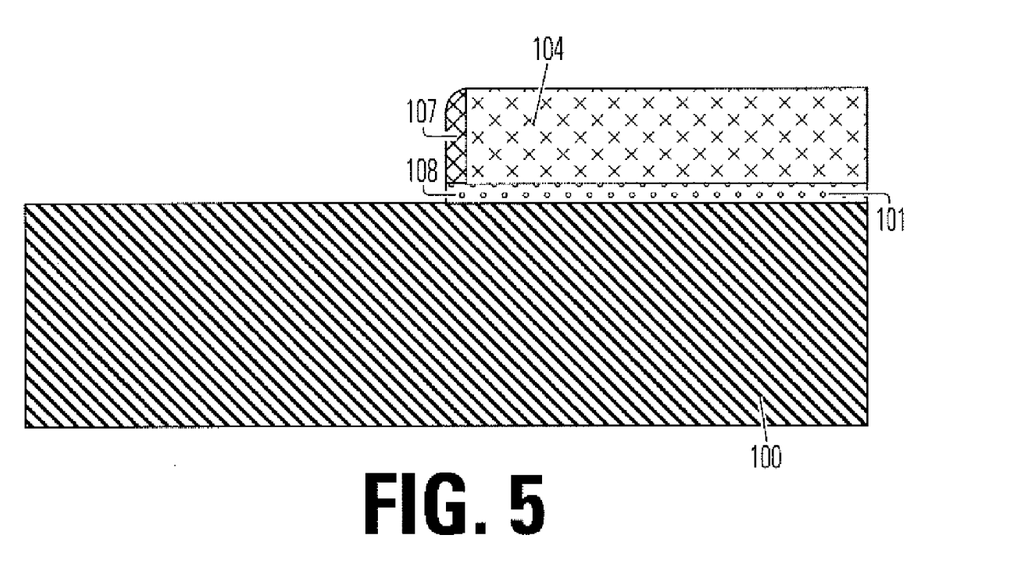
FIG. 5 illustrates a fourth stage in a procedure for forming a narrow bridge of material, based on a two-sided, side wall mask procedure.

Next, as shown in FIG. 5, the sidewall material 106 is etched anisotropically and selectively to form sidewall etch mask 107. In the embodiment in which the material in layer 106 comprises silicon nitride, the etch can probably be done using a $CHF_3/O_2$ reactive ion etch recipe, which will stop on layer 101. The sidewall etch mask has a first side away from the ledge and a second side proximate to the ledge, defining a width of the sidewall etch mask 107. The layer 101 is then etched, using the first side of the sidewall etch mask away from the ledge to define the end 108 of the layer 101, and stopping at or near the surface of the substrate 100, so that the end 108 of the layer 101 is beneath the sidewall etch mask 107, extending beyond the ledge 105 in the patterned sacrificial layer 104. The layer 101 can be etched using the same etch step as applied for the sidewall etch when the sidewall material and the layer 101 have similar etch chemistries, or using another etch exposure with an etch chemistry selective for the layer 101. For the embodiment described above in which the layer 101 comprises GST and the sidewall etch mask comprises silicon nitride, the etch can be done using a $CF_4/Ar$ reactive ion etch recipe with slight over etching into the TiN substrate.

Figure 6:
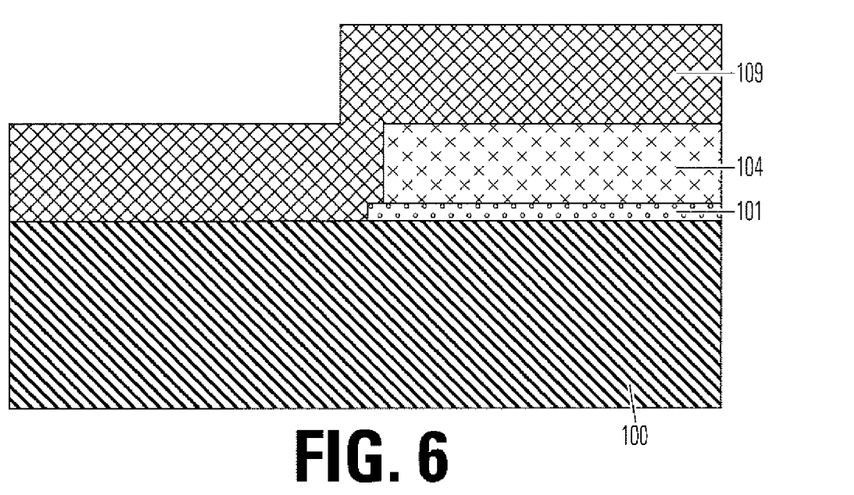
FIG. 6 illustrates a fifth stage in a procedure for forming a narrow bridge of material, based on a two-sided, side wall mask procedure.
Figure 7:
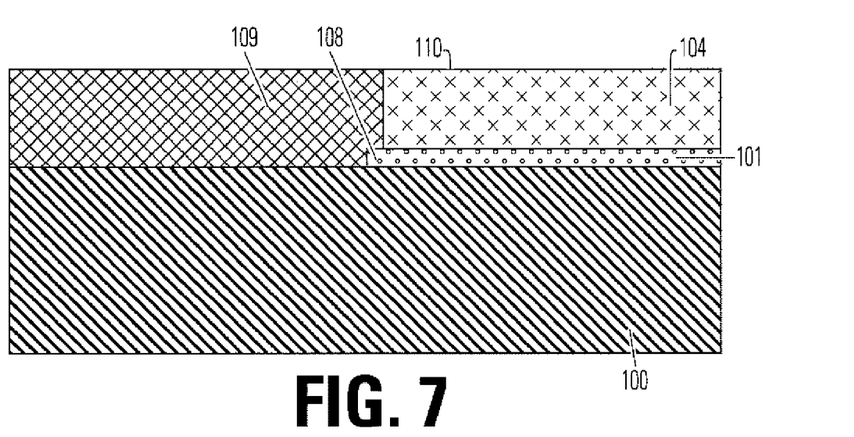
FIG. 7 illustrates a sixth stage in a procedure for forming a narrow bridge of material, based on a two-sided, side wall mask procedure.

FIG. 6 shows the next step, in which a layer 109 of material, such as the material used to form the sidewall etch mask 107, is formed over the resulting structure. Next, a planarization technique is applied to remove the portions of the layer 109 that are over the sacrificial layer 104, exposing the surface 110 of the sacrificial layer 104, as illustrated in FIG. 7, to subsequent etch processes. As can be seen, the end 108 of the layer 101 is beneath the still present sidewall etch mask. When layer 109 comprises the same material as the sidewall etch mask 107, the sidewall etch mask essentially merges with the remaining portions of layer 109.

Figure 8:
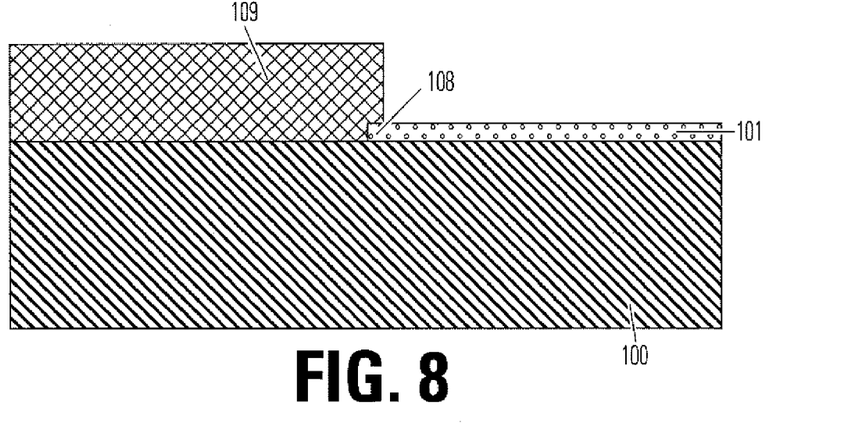
FIG. 8 illustrates a seventh stage in a procedure for forming a narrow bridge of material, based on a two-sided, side wall mask procedure.

FIG. 8 shows the results of selectively etching the sacrificial layer 104, leaving the side wall structure 107 and remaining portions of the layer 109, and the layer 101 extending beneath the side wall etch mask on the edge of the remaining portions of the layer 109. The resulting structure provides an etch mask relying on the second side of the sidewall etch mask that was proximate to the pattern material in layer 104 for alignment of the etch step.

Figure 9A:
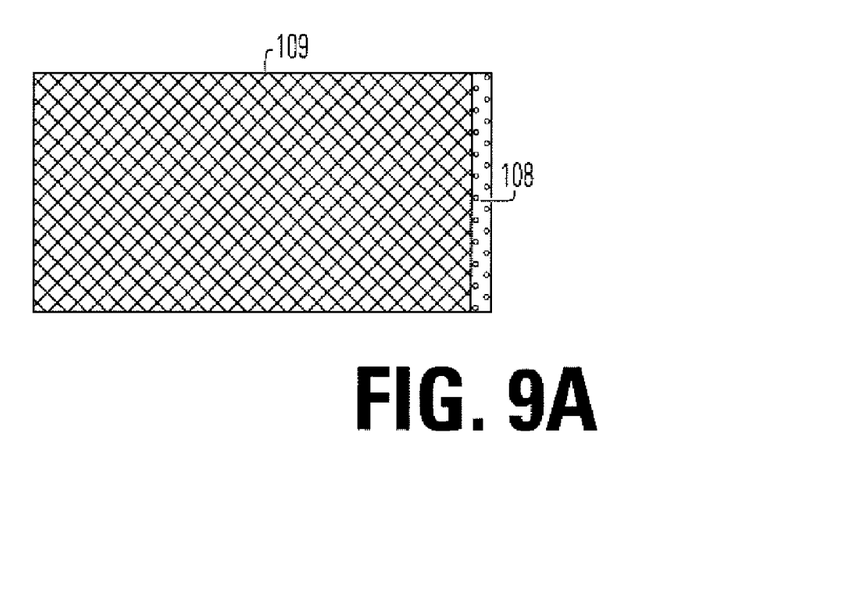
FIGS. 9A-9B illustrate an eighth stage in a procedure for forming a narrow bridge of material, based on a two-sided, side wall mask procedure.
Figure 9B:
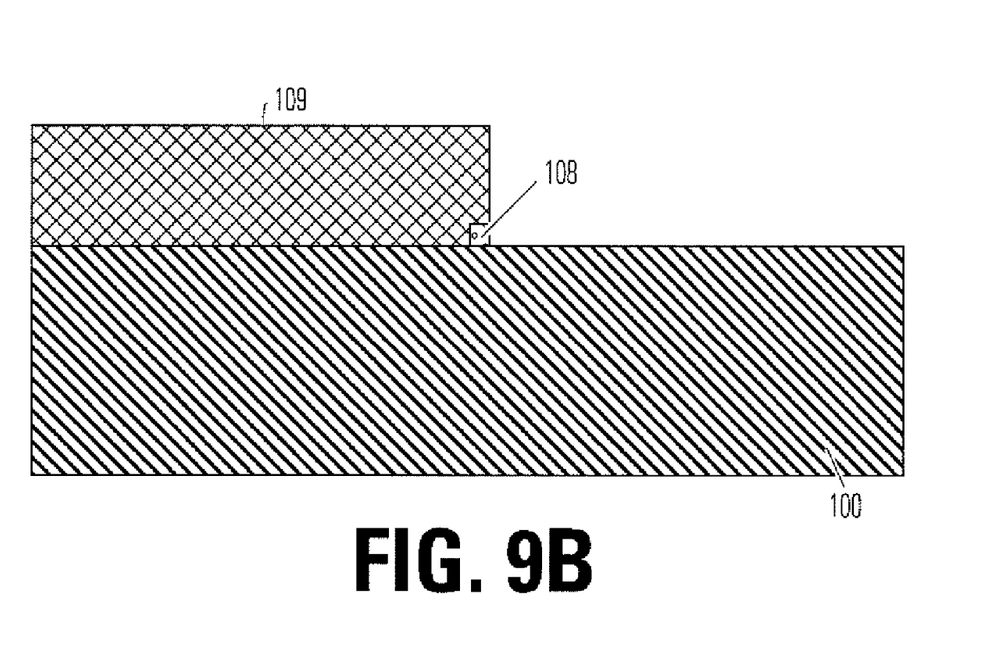

FIGS. 9A-9B illustrate a next step in the formation of the narrow line 108 of material by a sidewall masking technique. In FIG. 9A, a top view of the layer 109 with the thin line comprising end 108 of the material from layer 101 underneath the edge shown (it is actually beneath the edge of the layer 109 as shown in FIG. 9B), after removal of the portions of layer 101 not protected by the material 109.

FIG. 9B illustrates a side view, in which the end 108 of the layer 101 is protected by the material 109 over the substrate 100. In this manner, a narrow line of material is formed, such as a narrow line of memory material used for the bridges in the memory cell structure described above, which has a sub-lithographic width and a sub-lithographic thickness, both of which can be defined by thin film thicknesses. The width of the line is substantially defined by the width of the sidewall etch mask, depending on the verticality of the etch. With undercutting, the width of the line can be more narrow. With sloping etch profiles, the width of the line can be wider than the sidewall etch mask.

Figure 10A:
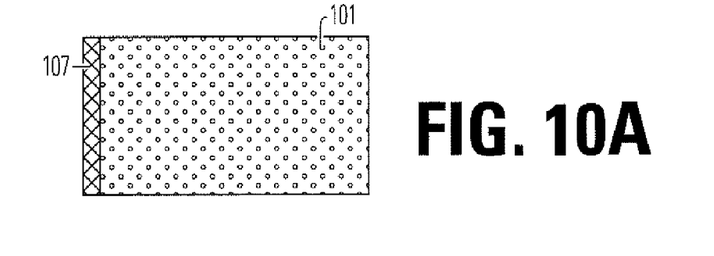
FIGS. 10A-10B illustrate a stage in a first alternative process, starting from the structure shown in FIG. 5.
Figure 10B:
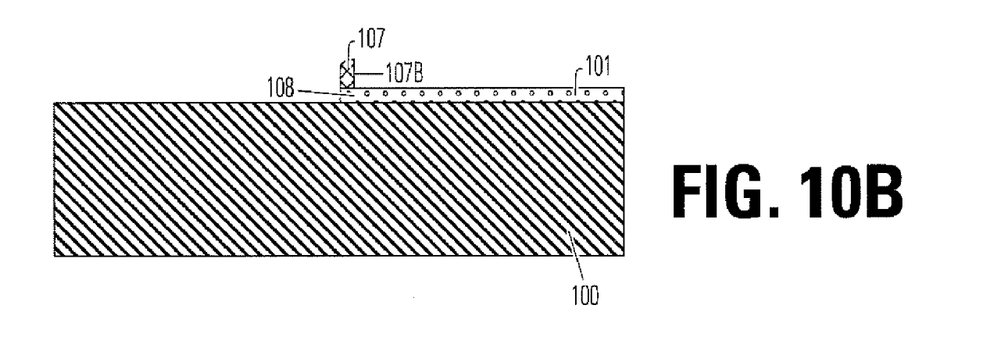

FIGS. 10A and 10B are layout and cross-section views of a stage in an alternative process, starting after the stage illustrated in FIG. 5, where sacrificial layer 104 remains after etching the layer 101 using the first side of the sidewall etch mask 107. As shown in FIG. 10A and in FIG. 10B, in the alternative process, rather than forming layer 109 as shown in FIG. 7, the sacrificial layer 104 is removed, leaving sidewall etch mask 107, in a line covering the end 108 of layer 101. The etching of the sacrificial layer 104 may reduce the height of the sidewall etch mask 107, as illustrated. The second side 107B of the sidewall etch mask 107 which was proximate to the ledge in the sacrificial layer 104 can now be used to align the etch process for the layer 101 and define a second side of the narrow structure formed by the end 108 of the layer 101 remaining after the etch process. In an embodiment in which layer 104 comprises silicon oxide and the sidewall etch mask comprises silicon nitride on a GST layer, the etch recipe can include a $C_4F_8/CO/Ar/O_2$ reactive ion etch.

Figure 11A:
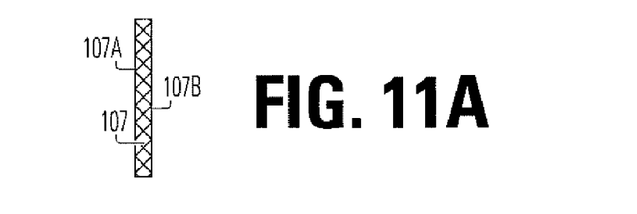
FIGS. 11A-11B illustrate another stage in the first alternative process.
Figure 11B:
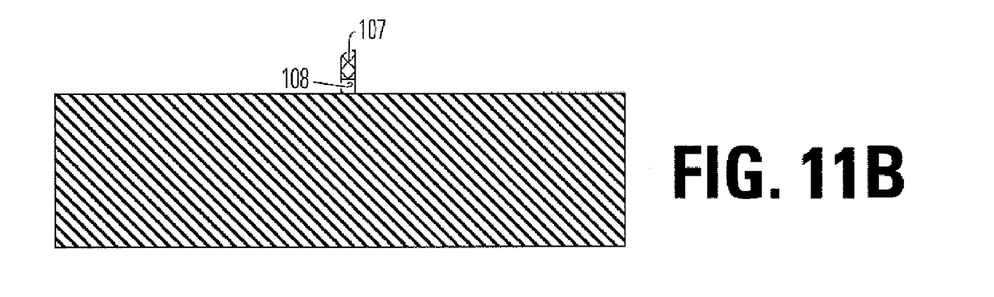

FIGS. 11A and 11B are layout and cross-section views of a next stage in the alternative process, after removal of the portions of layer 101 that are not covered by the sidewall etch mask 107. As illustrated, the end 108 of the layer 101 remains under the sidewall etch mask 107. The first side 107A of the sidewall etch mask that was away from the ledge in the sacrificial layer 104 is used to define one side of the line formed by the end 108 of the layer 101, and the second side 107B of the sidewall etch mask that was proximate to the ledge in the sacrificial layer 104 is used to define the other side of the line formed by the end 108 of the layer 101.

Figure 12:
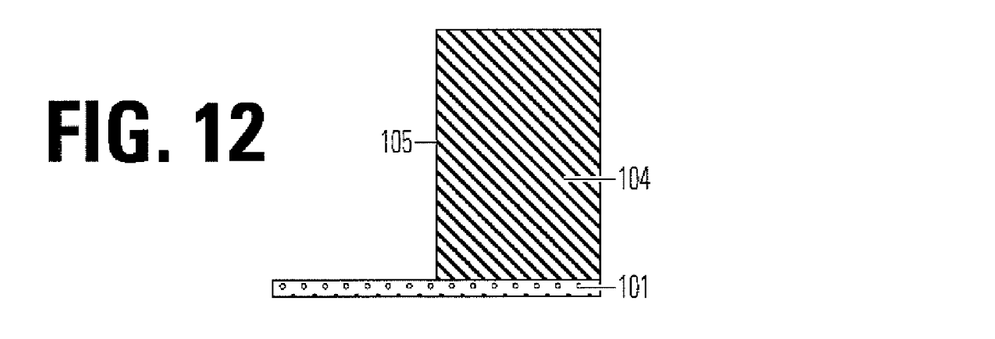
FIG. 12 illustrates a stage in a second alternative process using sidewall etch mask structures.
Figure 13:
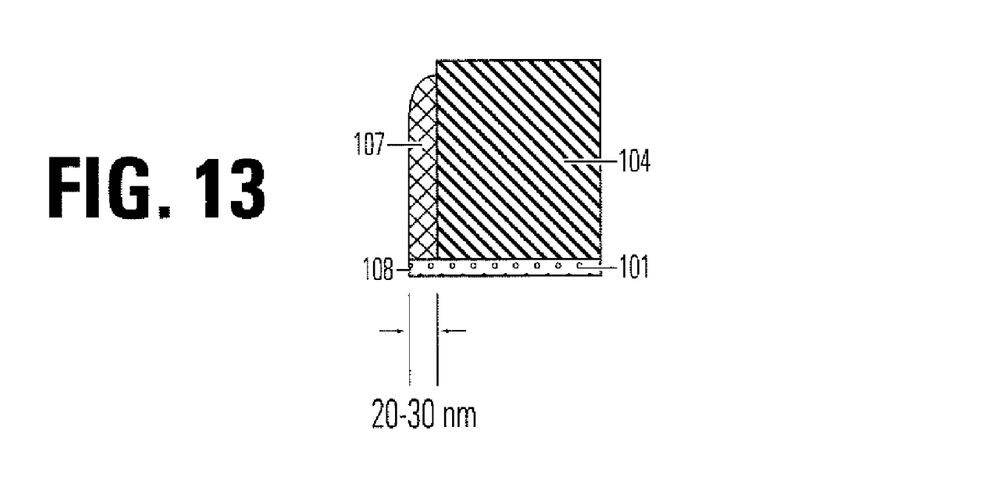
FIG. 13 illustrates a stage in the second alternative process which includes FIG. 12 using sidewall etch mask structures.
Figure 14:
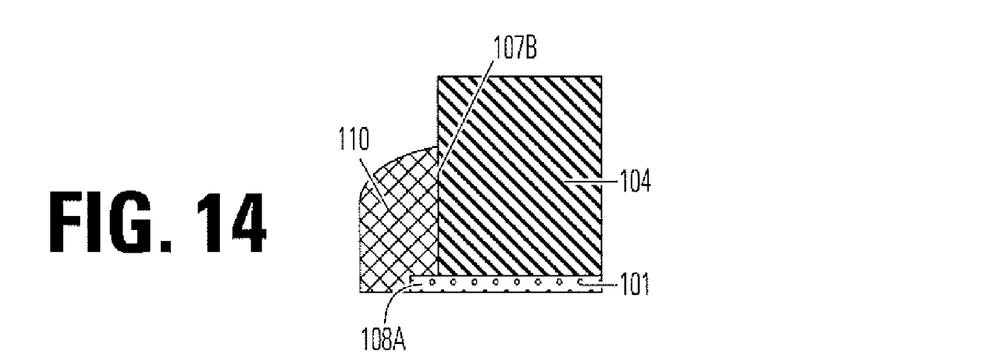
FIG. 14 illustrates a stage in the second alternative process which includes FIG. 13 using sidewall etch mask structures.

FIGS. 12-14 illustrate stages in another alternative process using a sidewall etch mask to make a narrow line of material. In FIG. 12, the layer 101 of material is formed on a substrate (not shown) with the patterned sacrificial layer 104 having ledge 105 formed thereon. In a next stage, as shown in FIG. 13, a sidewall etch mask 107 is formed as described above. The side of the sidewall etch mask away from the ledge 105 is used to define the side 108A of the end portion 108 of the layer 101.

FIG. 14 illustrates a next stage, in which a covering sidewall structure 110 is formed over the sidewall etch mask 107 by depositing a thicker layer of material, such as the same material used to form the sidewall etch mask 107, and then anisotropically etching the material to form the wide covering sidewall structure 110. The wide covering sidewall structure 110 extends over the side 108A of the end of layer 101 down to the substrate (not shown). During subsequent processes using the second side 107B of the sidewall etch mask to define the narrow line, the covering sidewall structure 110 protects the side 108A from exposure to etch processes.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for manufacturing a narrow structure, comprising:
   providing a substrate having a top surface;
   forming a layer of first material on the substrate;
   forming a layer of a pattern material on the layer of first material;
   defining a pattern in the layer of pattern material, the pattern including a ledge in the pattern material having a sidewall extending substantially to the layer of first material;
   depositing a sidewall material over the ledge in the pattern material, and etching the sidewall material to form a sidewall etch mask on the ledge, the sidewall etch mask having a first side away from the ledge and a second side proximate to the ledge, and covering the layer of first material in a line with a width between the first and second sides; and
   etching the layer of first material using the first side of the sidewall etch mask and the pattern in the layer of pattern material as an etch mask;
   depositing a second layer of material over the sidewall etch mask, the layer of pattern material, and exposed portions of the layer of first material;
   applying a planarization technique to remove portions of the second layer of material over the pattern in the layer of pattern material, exposing the pattern in the layer of pattern material and leaving a second pattern in the second layer of material over the substrate on the second side of the sidewall etch mask;
   removing the exposed pattern in the layer of the pattern material; and
   second etching remaining portions of the first material using the second side of the sidewall etch mask and the second pattern in the second layer of material as an etch mask to define a line of the first material on the substrate having a width substantially determined by the width of the sidewall etch mask.

2. The method of claim 1, wherein the pattern material and the sidewall material comprise materials that have different etch chemistries, allowing selective etching of the pattern material and the sidewall material.

3. The method of claim 1, wherein the first material and the sidewall material comprise materials that have different etch chemistries, allowing selective etching of the first material and the sidewall material.

4. The method of claim 1, wherein the pattern material and the sidewall material comprise insulating materials and the first material comprises a memory material.

5. The method of claim 1, wherein the pattern material and the sidewall material comprise insulating materials and the first material comprises a phase change memory material.

6. The method of claim 1, wherein the pattern material and the sidewall material comprise insulating materials and the first material comprises a programmable resistive memory material.

7. A method for manufacturing a memory device, comprising:
   forming a substrate having a top surface, the substrate including a first electrode, a second electrode and an insulating member between the first and second electrodes at the top surface of the substrate;
   forming a bridge of memory material on the top surface of a substrate contacting and extending between the first electrode and the second electrode, wherein said forming a bridge includes:
   forming a layer of memory material on the substrate;
   forming a layer of a pattern material on the layer of memory material;
   defining a pattern in the layer of pattern material, the pattern including a ledge in the pattern material having a sidewall extending substantially to the layer of memory material;
   depositing a sidewall material over the ledge in the pattern material, and etching the sidewall material to form a sidewall etch mask on the ledge, the sidewall etch mask having a first side away from the ledge and a second side proximate to the ledge, and covering the layer of memory material in a line with a width between the first and second side along the ledge; and
   etching the layer of memory material using the first side of the sidewall etch mask and the pattern in the layer of pattern material as an etch mask;
   depositing a second layer of material over the sidewall etch mask, the layer of pattern material, and exposed portions of the layer of memory material;
   applying a planarization technique to remove portions of the second layer of material over pattern in the layer of pattern material, exposing the pattern in the layer of pattern material and leaving a second pattern in the second layer of material over the substrate on the second side of the sidewall etch mask;
   removing exposed pattern in the aver of the pattern material; and
   second etching remaining portions of the memory material using the second side of the sidewall etch mask and the second pattern in the second layer of material as an etch mask to define a line of the memory material on the substrate having a width substantially determined by the width of the sidewall etch mask.

8. The method of claim 7, wherein the pattern material and the sidewall material comprise materials that have different etch chemistries, allowing selective etching of the pattern material and the sidewall material.

9. The method of claim 7, wherein the memory material and the sidewall material comprise materials that have different etch chemistries, allowing selective etching of the first material and the sidewall material.

10. The method of claim 7, wherein the width of the insulating member is about 50 nm or less, the line of memory material has a width about 50 nm or less and a thickness about 50 nm or less contacting the first and second electrodes on the substrate.

11. The method of claim 7, wherein said line has a thickness about 30 nm or less and a width of about 30 nm or less.

12. The method of claim 7, wherein the memory material comprises an alloy including a combination of Ge, Sb, and Te.

13. The method of claim 7, wherein the memory material comprises an alloy including a combination of two or more materials from the group of Ge, Sb, Te, Se, In, Ti, Ga, Bi, Sn, Cu, Pd, Pb, Ag, S, and Au.

* * * * *

UNITED STATES PATENT AND TRADEMARK OFFICE
CERTIFICATE OF CORRECTION

| | |
|---|---|
| PATENT NO. | : 7,514,367 B2 |
| APPLICATION NO. | : 11/382739 |
| DATED | : April 7, 2009 |
| INVENTOR(S) | : Hsiang-Lan Lung et al. |

It is certified that error appears in the above-identified patent and that said Letters Patent is hereby corrected as shown below:

In claim 7, column 12, line 37 delete the word "aver" and insert the word -- layer --.

Signed and Sealed this

Twenty-sixth Day of January, 2010

David J. Kappos
*Director of the United States Patent and Trademark Office*